(12) United States Patent
Vacca

(10) Patent No.: US 9,475,033 B2
(45) Date of Patent: Oct. 25, 2016

(54) DISPENSABLE POLYMERIC PRECURSOR COMPOSITION FOR TRANSPARENT COMPOSITE SORBER MATERIALS

(75) Inventor: Paolo Vacca, Milan (IT)

(73) Assignee: SAES GETTERS S.P.A., Lainate (MI) (IT)

( * ) Notice: Subject to any disclaimer, the term of this patent is extended or adjusted under 35 U.S.C. 154(b) by 405 days.

(21) Appl. No.: 13/819,623

(22) PCT Filed: Sep. 14, 2011

(86) PCT No.: PCT/EP2011/065933
§ 371 (c)(1),
(2), (4) Date: Feb. 27, 2013

(87) PCT Pub. No.: WO2012/045557
PCT Pub. Date: Apr. 12, 2012

(65) Prior Publication Data
US 2013/0181163 A1  Jul. 18, 2013

(30) Foreign Application Priority Data
Oct. 8, 2010 (EP) .................................. 10425328

(51) Int. Cl.
| | | |
|---|---|---|
| B01J 20/26 | (2006.01) | |
| B01J 20/04 | (2006.01) | |
| C08F 222/10 | (2006.01) | |
| C09D 133/14 | (2006.01) | |
| H01L 23/26 | (2006.01) | |
| B01J 20/30 | (2006.01) | |
| B01J 20/32 | (2006.01) | |
| B01J 20/28 | (2006.01) | |
| H01L 51/52 | (2006.01) | |

(52) U.S. Cl.
CPC .............. *B01J 20/261* (2013.01); *B01J 20/046* (2013.01); *B01J 20/26* (2013.01); *B01J 20/265* (2013.01); *B01J 20/267* (2013.01); *B01J 20/28026* (2013.01); *B01J 20/3035* (2013.01); *B01J 20/3204* (2013.01); *B01J 20/327* (2013.01); *B01J 20/3282* (2013.01); *B01J 20/3297* (2013.01); *C08F 222/1006* (2013.01); *C09D 133/14* (2013.01); *H01L 23/26* (2013.01); *B01J 2220/46* (2013.01); *H01L 51/5259* (2013.01); *H01L 2924/0002* (2013.01); *H01L 2924/12044* (2013.01)

(58) Field of Classification Search
CPC ..................................................... B01J 20/261
USPC ......................................................... 235/194
See application file for complete search history.

(56) References Cited

U.S. PATENT DOCUMENTS

| | | | |
|---|---|---|---|
| 2003/0037677 A1* | 2/2003 | Boroson et al. ................ 96/108 |
| 2005/0165208 A1* | 7/2005 | Popp et al. .................... 528/300 |
| 2006/0060086 A1* | 3/2006 | Wang et al. .................... 96/108 |
| 2006/0088663 A1* | 4/2006 | Cho et al. ...................... 427/384 |
| 2008/0093059 A1* | 4/2008 | Nishida ......................... 165/133 |
| 2008/0153371 A1* | 6/2008 | Losch et al. .................. 442/118 |
| 2008/0214725 A1* | 9/2008 | Herrlich-Loos et al. ..... 524/543 |
| 2011/0315923 A1* | 12/2011 | Vacca et al. .................. 252/194 |
| 2013/0181163 A1* | 7/2013 | Vacca .......................... 252/194 |

FOREIGN PATENT DOCUMENTS

| | | |
|---|---|---|
| EP | 1288251 | 3/2003 |
| EP | 1652581 | 5/2006 |
| EP | 1655792 | 5/2006 |
| WO | 2004/072604 | 8/2004 |
| WO | 2009/056536 | 5/2009 |
| WO | WO 2009056536 A2 * | 5/2009 ............... C08K 3/24 |

OTHER PUBLICATIONS

Chemistry and Properties of Crosslinked Polymers. Santokh S. Labana. Ford Motor Company, 1977.*
Lim, et al., Correlation between dark spot growth and pinhole size in organic light-emitting diodes, Applied Physics Letters 2001, 78: 2116-2118.
Ramelow, et al., Electrical conductivities of photochemically prepared polyethylene glycol dimetharcylate, reacted with iodine and lithium perchlorate dopants and activation energy determination for polymer-dopant interaction, Journal of Applied Polymer Science 2009, 112: 1916-1926.
Ramelow, et al., Synthesis of Ethylene Glycol Dimethacrylate-Methyl Methacrylate Copolymers, Determination of their Reactivity Ratios, and a Study of Dopant and Temperature Effects on their Conductivities, *Polymers*, vol. 2. pp. 265-285, Aug. 26, 2010.
International Search Report issued for PCT Application No. PCT/EP2011/065933 filed on Sep. 14, 2011 in the name of SAES Getters S.P.A.; mailing date: Dec. 23, 2011.
Written Opinion issued for PCT Application No. PCT/EP2011/065933 filed on Sep. 14, 2011 in the name of SAES Getters S.P.A.; mailing date: Dec. 23, 2011.
International Preliminary Report on Patentability issued for PCT Application No. PCT/EP2011/065933 filed on Sep. 14, 2011 in the name of SAES Getters S.P.A.; mailing date: Oct. 8, 2012.

* cited by examiner

*Primary Examiner* — Mark Eashoo
*Assistant Examiner* — M. Reza Asdjodi
(74) *Attorney, Agent, or Firm* — Steinfl & Bruno, LLP

(57) ABSTRACT

A moisture sorbing acrylic-based composition comprising an ethylene glycol dimethacrylate as main liquid component, and a metal perchlorate therein dissolved is described. Use of the composition in order to obtain a moisture sorber material is also described, to be inserted for example in electronic or optoelectronic devices.

17 Claims, No Drawings

DISPENSABLE POLYMERIC PRECURSOR COMPOSITION FOR TRANSPARENT COMPOSITE SORBER MATERIALS

CROSS REFERENCE TO RELATED APPLICATIONS

The present application is the US national stage of International Application PCT/EP2011/065933 filed on Sep. 14, 2011, which, in turn, claims priority to European Patent Application 10425328.1 filed on Oct. 8, 2010.

The present invention relates to a dispensable polymeric precursor composition useful for manufacturing composite sorber materials able to protect moisture sensitive elements in electronic or opto-electronic devices.

Moisture results to be harmful for the function and the lifetime of several devices. Among these devices, for example, opto-electronic devices based on OLED structures (Organic Light Emitting Diode) as well as OLET ones (Organic Light Emitting Transistors) or MEMS devices (MicroElectroMechanical Systems) can be mentioned as the most interesting ones. Other examples of sensitive devices are the photovoltaic cells, such as the OSC (Organic Solar Cells). In a broadest meaning, with sensitive device it is intended any sealed device in which the presence of $H_2O$ results to be harmful even at low levels, generally lower than 5000 ppm.

The progressive deterioration of the performances as effect of the presence of $H_2O$ has been object of several studies and scientific papers. As example, for OLED devices further information on this aspect can be found in the article "Correlation between dark spot growth and pinhole size in organic light emitting diodes" by Shuang Fang Lim et al., published in Applied Physics Letters, volume 78 no. 15 on 9 Apr. 2001.

In order to limit or avoid the jeopardizing of the performances of a moisture sensitive device, $H_2O$ is generally removed by using drying elements in its enclosure, i.e. as described in the international patent application published as WO 2004/072604, in the applicant name, disclosing the use of active components dispersed in suitable porous matrix, wherein as active component or material is intended a chemical species able to absorb moisture. This kind of solution is useful to obtain discrete sorbing elements to be inserted in the housing of the device. Its use, even if it is effective with respect to the removal of moisture, depends on some technological requirements during the device manufacturing process. In fact it is required to avoid the sorbing element exposure to environmental conditions (or limiting it as much as possible). Because it is directed to a discrete sorbing element that must be activated before the insertion in the sensitive device, it requires the use of special processing chamber filled with inert gas atmosphere, that are not well accepted because usually too expensive and limiting for mass production. Another strongly limiting characteristic is, generally, the non transparency of the sorbing element that involves the possibility of its use only in a limited number of positions inside the device enclosure.

Moreover, an in situ polymerization of the matrix after deposition of the precursors composition as described in WO 2004/072604 is not easy applicable in a manufacturing process because the involved chemistry causes the release of gaseous species (i.e. $H_2O$, $O_2$, $CO_2$ etc.). This gas generation can result in a damaging of the sensitive structures of the final device or in a undesired overpressure in its housing.

Recently, some patent applications have been related to different possible ways to insert a sorbing material in the final sensitive device in order to maintain, as secondary property, the transparency of the material when it consists of a dispersed active phase in a transparent matrix. A first type of these solutions is described in the European Patent application published as EP 1288251, in the name of Eastman Kodak Company, wherein it is requested that the dimensions of the active material particles are less of 100 nm. Similarly, the European Patent application published as EP 1655792, in the name of Samsung SDI Company, describes the use of a transparent moisture absorption layer based on a dispersion of metal oxide or metal salt with a distribution of the particle size having 100 nm or less as average value. The production of the composite materials described in both the above referred publications shows the disadvantages associated to the use of nanometric particles of the active material. In fact, it is well known that they require special precautions for their handling if said particles have diameter smaller than 100 nm. Moreover they have as intrinsic properties the tendency to form aggregates and therefore it is often difficult to obtain an homogeneous distribution in the polymeric matrix used as binder.

An example of alternative solution to the above described control in the particle size, the choice of specific active phase is described in the United States Patent Application published as US 2006/0060086, in the name of Eastman Kodak Company, wherein the desiccant composite is based on a dissolved organometallic complex. The production of the composite materials described in this publication shows the disadvantages associated to the relatively high cost of the active phase and a limited chance to be used in device manufacturing processes requiring a complete absence of volatile species. In fact, US 2006/0060086 discloses a composite material in which the active phase is generally dissolved in an organic solvent before the addition to the polymeric matrix. The alternative method consisting in heating of the polymer to improve the solubility of the active species is often inapplicable because limited by the thermal stability of the organometallic compound or of the polymeric binder. The European Patent application published as EP 1652581 in the name of Dupont Company describes the use of a long and variegate acrylate monomers suggested as precursors for the binder in composite sorbers compositions. The general disclosed getter compositions require an additional firing for the activation of the getter and the use of a solvent to adjust the viscosity, allowing the use of the desired deposition method.

In the International Patent application published as WO 2009/056536, in the applicant's name, it is described a method for obtaining a composite sorber for the removal of $H_2O$ comprising a polymeric matrix and a hygroscopic inorganic salt. The method consists in preparing a liquid monomer or polymer, completely dissolving an inorganic salt therein and in finally consolidating the precursor composition by a UV or thermal treatment. In other words, the active material represented by the inorganic salt is completely dissolved in the organic polymer, in a concentration lower than the relevant solubility limit in the same way as it happens for a solute in a liquid solvent. Among the possible disclosed possibilities, the most interesting is based on the solubility of active species in the liquid organic precursor without using a solvent. In fact the solvent, during the consolidation of the polymeric matrix, has to be removed therefrom and, as previously described, the release of volatile species is not well-accepted in the manufacturing process of a electronic or opto-electronic device. One of the preferred embodiments consists in the use of a mixture of polymethylmethacrylate (PMMA) and methylmetacrylate (MMA) as polymeric precursor. It consents to minimize the outgassing and the shrinkage with respect to using only low molecular weight organic precursors, but the volume decreasing might be anyway incompatible with its use as filler material in the housing of the final device because the MMA has a high vapor pressure. Moreover, the presence of methylmetacrylate in the vapor state may be chemically incompatible with many organic semiconductor structures. These features, in particular, are not compatible with some processes used to dispense liquid material in encapsulating manufacturing process. In addition, shrinkage is usually associated to high roughness of the consolidated sorber material.

The stronger drawbacks of prior art compositions can be observed when manufacturers insert the sorbing material precursor as filler material of the device internal "free volume" requiring vacuum conditions. As example of method to obtain a filler configuration of the sorbing material in the device, the One Drop Fill (ODF) process requires not only the stability in vacuum conditions, but also an UVA photo-reactivity and a high amount of dissolved moisture sorbing compound maintaining the transparency of the composite material. These are not guaranteed by the compositions disclosed in WO 2009/056536 or EP 1652581. Moreover, in order to obtain a complete polymerization, these prior art compositions require curing conditions that in many devices are not applicable because may jeopardize the performance of its active element, i.e. a polymeric semiconductor structure. In particular, a thermal curing with lasting time comprised between 30 minutes and 1 hour is usually requested for the crosslinking of the prior-art compositions.

Object of the present invention is thus to provide a polymeric precursor composition for moisture sorbing composite materials to be used in the manufacture of electronic and optoelectronic devices, which is free from the drawbacks of the prior art.

In a first aspect thereof, the invention consists in a moisture sorbing acrylic-based precursor composition comprising an ethylene glycol dimethacrylate as liquid component, and a metal perchlorate therein dissolved, characterized in that the composition further comprises a polymerization initiator and in that the ethylene glycol dimethacrylate amount is comprised between 60 and 90 weight percent, the metal perchlorate amount is between 1 and 40 weight percent and the polymerization initiator amount is between 0.1 and 2.0 weight percent with respect the total weight of the composition.

With respect to the prior art, the composition is suitable to completely polymerize in a shorter time and requiring a lower energy treatment. The maximum perchlorate concentration, very important in order to maximize the primary properties of the moisture sorbing composite (its moisture sorbing capacity), can be strongly increased with respect to other acrylate-based compositions. Moreover final sorber composite material can be obtained without losses in its transparency, that is a secondary but fundamental property. In addition, this important property is assured both for the polymerizable composition (precursor) and the polymerized moisture sorber composite (consolidate material). In fact, even if exposed to humidity, they maintain the transparency as well a lot of interesting properties from the applicative or processability point of view. Moreover the composition of the invention shows a low vapor pressure and it is solvent-free, giving advantages in many manufacturing aspects, as for example no contamination of the internal environment in the final device and absence of internal "air-bubbles" after its polymerization.

The inventors have discovered that the use of a ethylene glycol dimethacrylate as main component of the polymerizable composition gives all the above described improvement respect the prior art. From the compositional point of view, in fact, the invention differs in the fact that ethylene glycol dimethacrylate is used as monomer or oligomer to obtain the polymeric matrix containing the active sorbing species (i.e. the metal perchlorate). The prior art describes composition based on different polymerizable precursors, wherein the ethylene glycol dimethacrylate it is used only as cross-linking agent rather than as main constituent (in other words, in a low weight concentration dispersed in a main precursor). As example of the composition disclosed by the prior art we can refer to the Unites States Patent applications published as US 2008/0093059, US 2008/01533371 and US 2008/0214725.

According to the present invention, ethylene glycol dimethacrylates that may be used as main component in the precursor composition for a sorbing material diethylene glycol dimethacrylate, triethylene glycol dimethacrylate, tetraethylene glycol dimethacrylate or polyethylene glycol dimethacrylate are preferred. In a particularly preferred embodiment of the invention, polyethylene glycol dimethacrylate with a average value of molecular weight comprised between 330 and 780 gr*mol$^{-1}$ can be used.

Between metal perchlorates, the present invention preferably envisions the use of at least one of an alkaline or alkaline-earth metal perchlorate. In a preferred embodiment magnesium perchlorate $Mg(ClO_4)_2$ is selected as inorganic dryer agent in a concentration comprised between 1 and 40 percent with respect to the total weight of the composition.

Suitable polymerization initiators can be selected between photoinitiator or thermal initiator. In the first case, a preferred embodiment consists in using a difunctional-α-ketone in a concentration between 0.1 and 2.0 percent with respect to the total weight. In the second case, as example, a 2,2'-azobisisobutyronitrile amount between 0.5 and 1.0 percent with respect to the total weight may be employed. Generally the preferred concentration of the polymerization initiator is comprised between 0.5 and 1.0 percent with respect to the total composition weight.

In an alternative embodiment of the invention, trimethacrylates are added to the composition as crosslinking agent in amount comprised between 0.5 and 5 percent with respect to the total composition weight.

Moreover, as additional and optional additives, inhibitors and/or inert organic filler can be advantageously used. As example, inhibitors can be selected between hydroquinone, hydroquinone mono methyl ether, butylated hydroxytoluene in weight concentration comprised between 50 and 1500 ppm respect the total polymeric composition weight. Organic fillers useful to be used without modification of optical properties in the final sorbing composite material are spherical particles with chemical affinity to the precursor composition. As example, spherical particles of poly(methyl methacrylate-co-ethylene glycol dimethacrylate) with average particle size lower than 10 microns can be used to increase the precursor solution viscosity in amount below the 10 w/w % respect the total polymeric composition object of the invention. These organic fillers can be used also like light diffusing agent for the final layer.

In a second aspect thereof, the invention consists in a method for the manufacturing of a moisture sorber material by polymerization of a transparent moisture sorbing acrylic-based composition comprising an ethylene glycol dimethacrylate as liquid component, and a metal perchlorate dissolved therein, said composition characterized in that it further comprises a polymerization initiator and in that the ethylene glycol dimethacrylate amount is comprised between 60 and 90 weight percent, the metal perchlorate amount is between 1 and 40 weight percent and the polymerization initiator amount is between 0.1 and 2.0 weight percent with respect the total weight of the composition. The polymerization treatment may consist in a photo-induced or thermal-induced curing process. As example, matrix polymerization may be obtained with a UV-curing process for 15 sec or thermal curing at 70° C. for 10 minutes. These polymerization processes minimize the exposure of the sensible structure of the device to UV light and result in a complete polymerization. In other words, differently the prior art, they do not require a post curing process. Typical polymerization conditions for the compositions object of the present invention consist in 100 mW/cm$^2$ to 500 mW/cm$^2$ at 365 nm for a exposure time ranging from 15 s to 240 s with a minimum dose of 100 mW/cm$^2$ for 15 s. This is a very important aspect because it allows the use of the compositions in manufacturing both bottom and top emission devices.

The method is advantageous when used for the mass production of a moisture sensible electronic or optoelectronic device that requires to minimize the volatile molecules release and/or the shrinkage related to the in-situ polymerization process of the composition to be used as precursor of the moisture sorber material deposed or inserted in the device structure.

In fact the present invention consists in the use, as precursor of the sorber material, of a composition with constituent relative amounts inverted with respect to the prior art, without resulting in any possible expected drawbacks in their application in semiconductor based devices. It is well known that similar compositions are used as electrolytes in some energy storage device (i.e. lithium batteries) because their electrical conductivies, described in several scientific articles as for example "Synthesis of Ethylene Glycol Dimethacrylate-Methyl Methacrylate Copolymers, Determination of their Reactivity Ratios, and a Study of Dopant and Temperature Effects on their Conductivities" by Ramelow et al., published in the 26 Aug. 2010 on Polymers, vol. 2 pagg. 265-285 or "Electrical Conductivities of Photochemically Prepared Polyethylene Glycol Dimethacrylate, Reacted with Iodine and Lithium Perchlorate Dopants and Activation Energy Determination for Polymer-Dopant Interaction" by Ramelow et al. published in the 12 Feb. 2009 on the Journal of Applied Polymer Science, vol. 112, pagg. 1916-1926. Compatibility with semiconductor structures may be therefore seen as unexpected. Among the sensitive devices that benefit the most from the application of the method of the invention there are photovoltaic cells, OLED displays, microelectromechanical devices and lithium batteries.

In general the method of the invention offers advantages when it is necessary that the H$_2$O concentration inside the sensitive device must not exceed a critical value during the normal functioning of the device. This critical value is related to the kind of sensitive device and among those which require a very low water concentration are the OLEDs, that typically need concentrations in the order of 10 ppm or less, whereas at the extreme opposite there are the solar cells, which can support up to 5000 ppm before irreversible deterioration phenomena are triggered.

In a third aspect thereof the invention consists in a sensitive device containing a moisture sorber deposit obtained by polymerization of a moisture sorbing acrylic-based composition comprising an ethylene glycol dimethacrylate as liquid component, and a metal perchlorate dissolved in, said composition characterized in that the composition further comprises a polymerization initiator and in that the ethylene glycol dimethacrylate relative amounts is comprised between 60 and 90 whereas the metal perchlorate is between 1 and 40 and the polymerization initiator is between 0.1 and 2, all composition constituent amounts expressed as weight percentage respect the total weight of the composition.

In one of the possible embodiments of the invention, the sensitive device contains the sorber material deposit in a localized area of its internal walls or substrates.

In an alternative embodiments, the sorber material is inserted in the device as transparent filler, i.e. as filling material of its internal free volume.

Photovoltaic cells, OLED displays, microelectromechanical devices and lithium batteries are possible examples of sensitive device candidate to obtain advantage by the use of the compositions object of the present invention.

EXAMPLE 1

A film of a sorber according to the present invention is produced by dissolving hygroscopic salt in a polyethylene glycol dimethacrylate solution. A solution is prepared by mixing 5.32 grams of polyethylene glycol dimethacrylate with 0.05 grams of trimethylolpropane trimethacrylate and 0.03 grams of a difunctional-α-ketone. Then a quantity of 0.6 grams of magnesium perchlorate is dissolved in the prepared solution.

The solution is spread out by means of a techniques known in the field as doctor blade with a thickness of 20 microns on a glass substrate and then an encapsulating sheet is aligned to the substrate under vacuum (the adopted vacuum is in the range $10^{-2}$-$10^{-3}$ mbar), brought in contact and pressed with gas pressure. All process is performed in a glove box under an inert gas flux in order not to compromise the sorbing capacity of the hygroscopic inorganic salt. Whilst pressing, the polymerization process is carried out by using a UV lamp with an irradiance of 100 mW/cm$^2$ focus at 365 nm for 15 s (radiation dose of 1.5 J/cm2). At the end of the process, the sample reveals a optical transmittance greater than 90% without evidence of non-solubilized particles salt, a weight loss of 0.19 wt % and a surface roughness in order of 20 nm.

EXAMPLE 2 (COMPARATIVE)

A film of a polymeric composite sorber is produced by using a methacrylate monomers as precursor composition (i.e. not according to the present invention). 0.4 grams of the inorganic salt is dissolved in 5.0 grams of methylmethacrylate (MMA) and 0.05 grams of benzoin methyl ether. The solution is spread out by means of a doctor blade with a thickness of 20 microns on a glass substrate and then an encapsulating sheet is aligned to the substrate under vacuum, brought in contact and pressed with gas pressure. Whilst pressing, the polymerization process is carried out by using a UV lamp with an irradiance of 100 mW/cm$^2$ and emission wavelength 250-400 nm for 30 s (radiation dose of 3.0 J/cm2). At the end of the process, the sample reveals an optical transmittance greater than 90% without evidence of non-solubilized particles salt but a weight loss higher than 70 wt % and a surface roughness of several microns.

EXAMPLE 3 (COMPARATIVE)

A film of a polymeric composite sorber is produced by not operating under the conditions of the invention i.e. using 1,4-butanediol dimethacrylate, a methacrylate monomer with high tension vapor pressure, BDDM, 0.1 grams of the inorganic salt is dispersed under stirring in 5.0 grams of 1,4-butanediol dimethacrylate (BDDM) and 0.05 grams of benzoin methyl ether. The solution is spread out by means of a doctor blade with a thickness of 20 microns on a glass substrate and then an encapsulating sheet is aligned to the substrate under vacuum, brought in contact with it and pressed with gas pressure. Whilst pressing, the polymerization process is carried out by using a UV lamp with an irradiance of 100 mW/cm$^2$ and emission wavelength 250-400 nm for 30 s (radiation dose of 3.0 J/cm$^2$). At the end of the process, the sample reveals a optical transmittance lower than 50% and there is evidence of non-solubilized particles salt.

The invention claimed is:

1. A moisture sorbing composition comprising:
    an ethylene glycol dimethacrylate,
    a metal perchlorate, and
    a polymerization initiator,
   wherein ethylene glycol dimethacrylate amount is comprised between 60 and 90 weight percent, metal perchlorate amount is between 1 and 40 weight percent and polymerization initiator amount is between 0.1 and 2.0 weight percent with respect the total weight of the composition, and wherein an optical transmittance of the moisture sorbing composition is greater than 90%.

2. The moisture sorbing composition according to claim 1, wherein the ethylene glycol dimethacrylate is selected from the group consisting of: diethylene glycol dimethacrylate, triethylene glycol dimethacrylate, tetraethylene glycol dimethacrylate, polyethylene glycol dimethacrylate and mixtures thereof.

3. The moisture sorbing composition according to claim 2 wherein the polyethylene glycol dimethacrylate has a molecular weight comprised between 330 and 780 gr*mol$^{-1}$.

4. The moisture sorbing composition according to claim 1 wherein the metal perchlorate is selected between an alkaline or alkaline-earth metal perchlorate.

5. The moisture sorbing composition according to claim 4 wherein the alkaline-earth metal perchlorate is magnesium perchlorate.

6. The moisture sorbing composition according to claim 1 wherein the polymerization initiator is a photoinitiator or a thermal initiator.

7. The moisture sorbing composition according to claim 1 wherein the photoinitiator is a difunctional-α-ketone in a concentration between 0.1 and 2.0 weight percent with respect the total weight of the composition.

8. The moisture sorbing composition according to claim 1 wherein the thermal initiator is a 2,2'-azobisisobutyronitrile in a concentration between 0.5 and 1.0 weight percent with respect the total weight of the composition.

9. The moisture sorbing composition according to claim 1 wherein the composition further contains a crosslinking agent in an amount comprised between 0.5 and 5 weight percent with respect the total weight of the composition.

10. The moisture sorbing composition according to claim 9 wherein the crosslinking agent is a trimethacrylate.

11. The moisture sorbing composition according to claim 1 wherein the composition further contains an inhibitor agent in an amount comprised between 50 and 1500 ppm with respect the total weight of the composition.

12. The moisture sorbing composition according to claim 11 wherein the inhibitor agent is selected from the group consisting of hydroquinone, hydroquinone mono methyl ether, and butylated hydroxytoluene.

13. The moisture sorbing composition according to claim 1 wherein the composition further contains organic fillers with chemical affinity to the precursor composition.

14. The moisture sorbing composition according to claim 13 wherein the organic fillers comprise Poly(methyl methacrylate-co-ethylene glycol dimethacrylate).

15. A method comprising:
    manufacturing a moisture sorber material by polymerization of a moisture sorbing composition wherein the moisture sorbing composition comprising:
    an ethylene glycol dimethacrylate,
    a metal perchlorate, and
    a polymerization initiator,
    wherein ethylene glycol dimethacrylate amount is comprised between 60 and 90 weight percent, metal perchlorate amount is between 1 and 40 weight percent and polymerization initiator amount is between 0.1 and 2.0 weight percent with respect the total weight of the composition, and wherein an optical transmittance of the moisture sorbing composition is greater than 90%.

16. The method according to claim 15 wherein the polymerization process is a photo-induced curing process.

17. The method according to claim 15 wherein the polymerization process is a thermal-induced curing process.

* * * * *